United States Patent
Murphy et al.

(10) Patent No.: US 8,395,164 B2
(45) Date of Patent: Mar. 12, 2013

(54) MULTILAYERED SEMICONDUCTOR WAFER AND PROCESS FOR MANUFACTURING THE SAME

(75) Inventors: Brian Murphy, Pfarrkirchen (DE); Reinhold Wahlich, Tittmoning (DE)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 13/225,826

(22) Filed: Sep. 6, 2011

(65) Prior Publication Data
US 2011/0316003 A1    Dec. 29, 2011

Related U.S. Application Data

(62) Division of application No. 12/438,818, filed as application No. PCT/EP2007/007391 on Aug. 22, 2007, now Pat. No. 8,039,361.

(30) Foreign Application Priority Data

Aug. 30, 2006    (EP) .................................... 06018100

(51) Int. Cl.
*H01L 29/15* (2006.01)
(52) U.S. Cl. .............................. 257/77; 438/455; 117/92
(58) Field of Classification Search .................. 438/455, 438/526; 257/77; 117/92
See application file for complete search history.

(56) References Cited

U.S. PATENT DOCUMENTS

| | | | |
|---|---|---|---|
| 5,374,564 A | 12/1994 | Bruel | |
| 6,328,796 B1 * | 12/2001 | Kub et al. | 117/94 |
| 6,391,799 B1 | 5/2002 | Di Cioccio | |
| 2004/0004271 A1 | 1/2004 | Fukuda et al. | |
| 2005/0026394 A1 * | 2/2005 | Letertre et al. | 438/459 |
| 2005/0255709 A1 | 11/2005 | Lee | |
| 2006/0267024 A1 | 11/2006 | Murphy et al. | |

FOREIGN PATENT DOCUMENTS

| | | |
|---|---|---|
| EP | 1727190 A1 | 11/2006 |
| FR | 2774214 A1 | 1/1998 |
| JP | 52-006080 A | 1/1977 |
| JP | 11-003842 A | 1/1999 |
| JP | 2001308026 A | 11/2001 |
| WO | 03/034484 A2 | 4/2003 |

OTHER PUBLICATIONS

Lindner, et al., keV- and MeV- Ion Beam Synthesis of Buried SiC Layers in Silicon, Mat. Res. Soc. Symp. Proc. vol. 354, pp. 171-176, 1995.*
J.K.N. Lindner, Silicone Carbide—Recent Major Advances, pp. 251-267, springer Verlag, Aug. 2004.
Mendez et al., "Planar Defects, Voids and their Relationship in 3C-SiC Layers", Materials Science Forum, vols. 483-485 (2005), pp. 189-192.
Zetterling et al., "Process Technology for Silicon Carbide Devices," EMIS Processing Series 2, Chapter 2, pp. 39-40, Nov. 1, 2002.
Takashi et al, "Comparative Study of Heteroepitaxially and Homoepitaxillay Grown 3C-SiC Films", Material Science Forum, vols. 389-393 (2002), pp. 323-326.

* cited by examiner

*Primary Examiner* — Julio J Maldonado
*Assistant Examiner* — Sonya D McCall Shepard
(74) *Attorney, Agent, or Firm* — Brooks Kushman P.C.

(57) ABSTRACT

Silicon carbide substrate wafers are prepared by transferring a monocrystalline silicon layer from a donor wafer onto a handle wafer, the silicon layer being implanted with carbon and annealed to form a monocrystalline SiC layer prior to or after transfer of the silicon layer.

14 Claims, 6 Drawing Sheets

Fig. 4
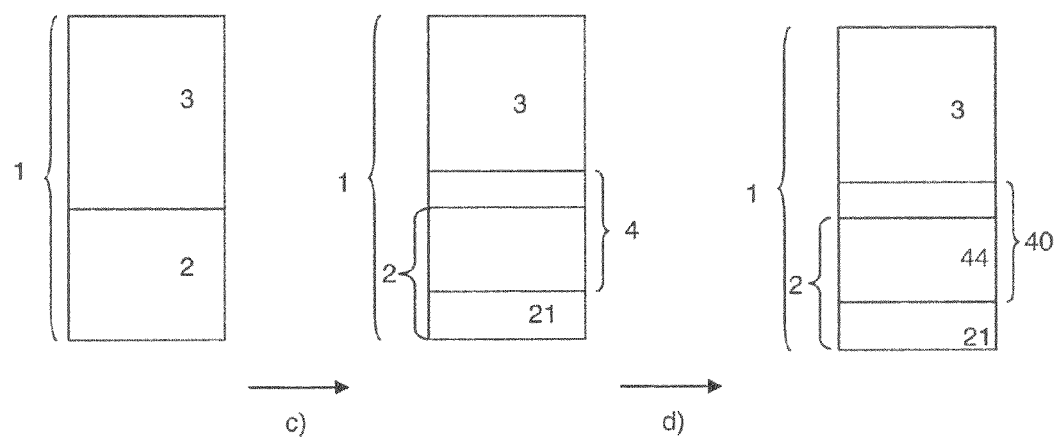
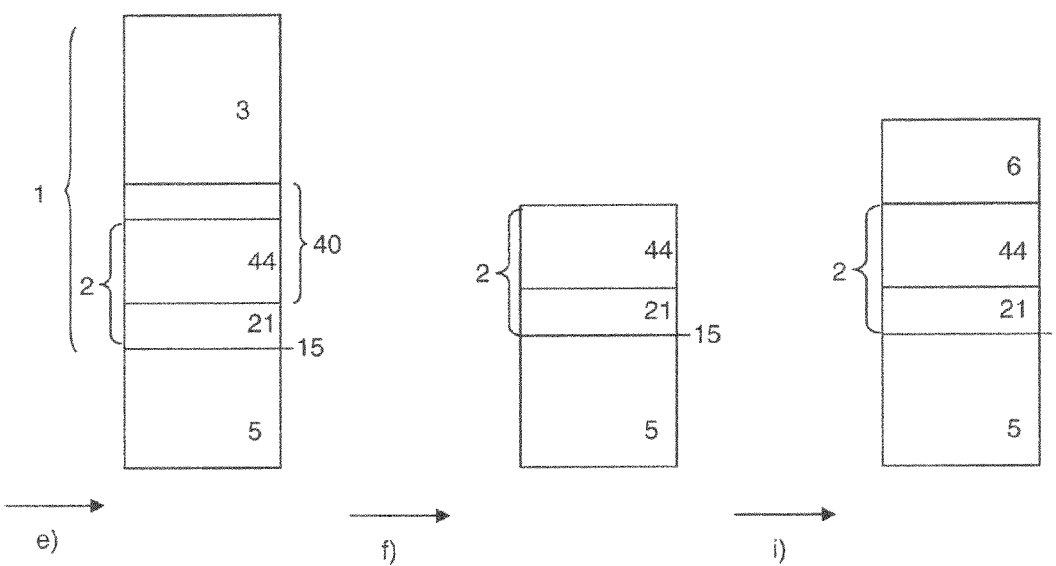

Fig. 6
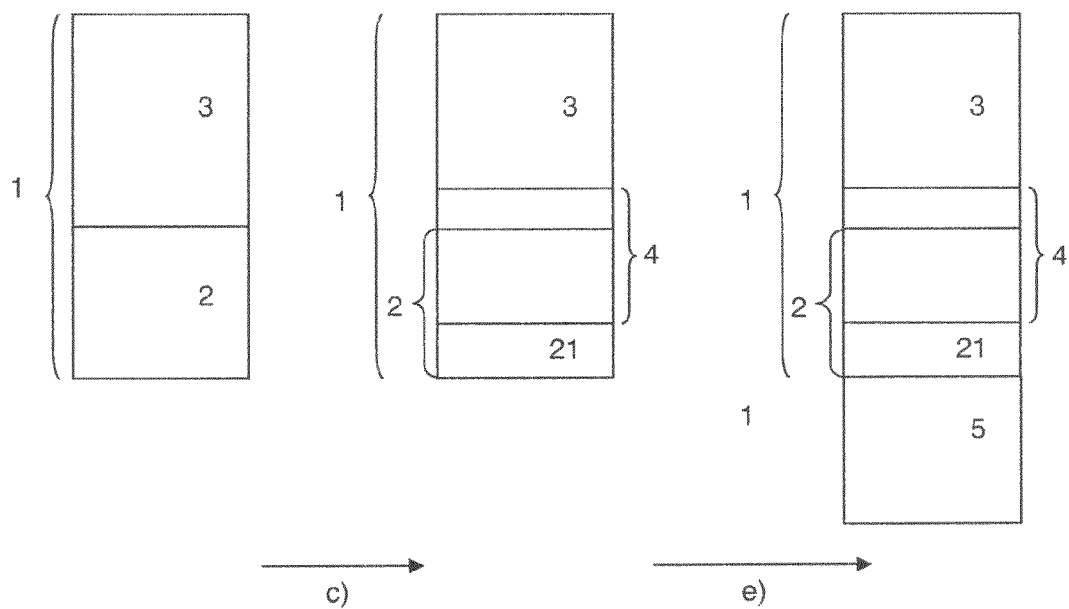
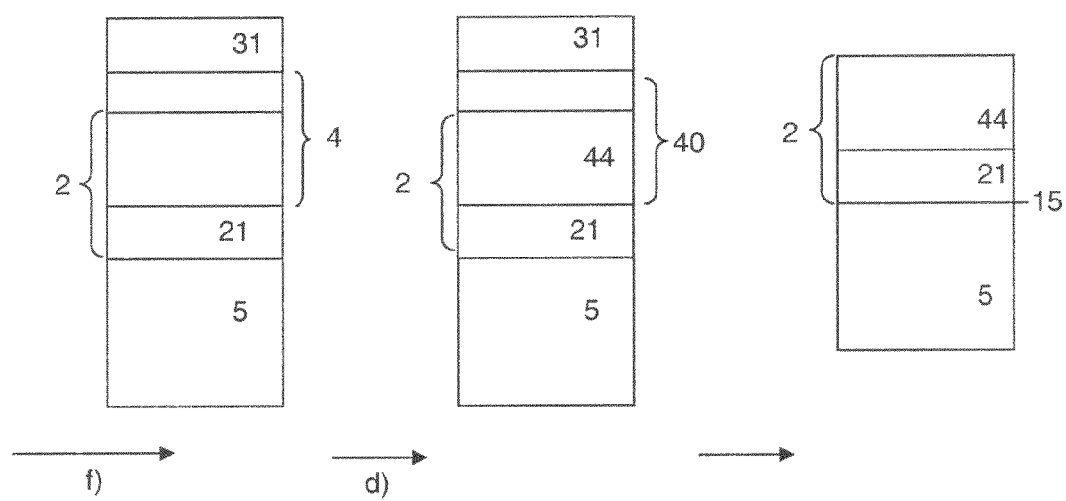

MULTILAYERED SEMICONDUCTOR WAFER AND PROCESS FOR MANUFACTURING THE SAME

CROSS-REFERENCE TO RELATED APPLICATION

This application is a division of and claims priority to U.S. application Ser. No. 12/438,818 filed Feb. 25, 2009, a national phase of PCT/EP2007/007391 filed Aug. 22, 2007, which claims priority to European application EP 06018100.5 filed Aug. 30, 2006, all of which are incorporated herein by reference.

BACKGROUND OF THE INVENTION

1. Field of the Invention

The present invention relates to a multilayered semiconductor wafer comprising a handle wafer and a silicon carbide donor layer and to a process for manufacturing it.

2. Description of the Related Art

Gallium nitride (GaN) is often used as an active layer in semiconductor devices due to its high direct bandgap, high electron saturation velocity and high voltage blocking capability. The direct bandgap is well suited for the manufacture of green and blue LEDs and laser diodes. Crystals of gallium aluminum nitride (GaAlN) and gallium indium nitride (GaInN) may also be used for these applications, GaAlN has a larger bandgap and GaInN has a smaller bandgap. Nitride based devices are also used in microwave devices, high power devices and HEMTs.

GaN crystals are, however, difficult to grow and as yet no commercial crystal growth process is available for production of pure crystal ingots. GaN wafers are normally produced by growth of GaN on suitable substrates with subsequent removal of the substrate. These 'quasi-bulk' GaN wafers exhibit a high defect density and are relatively expensive to grow. In many device applications a thin layer of GaN is grown on a suitable substrate.

Silicon carbide (SiC) substrates are often used as substrates for the growth of GaN films and wafers. While these substrates offer acceptable lattice constant matching and good electrical and thermal properties for GaN growth and device features they are limited to small diameters of less than 100 mm. Monocrystalline SiC wafers are much more expensive than silicon wafers. Furthermore, bulk SiC wafers have defects such as micropipes and different polytype inclusions, the defects being generated during crystal growth.

An alternative approach is to use bulk silicon wafers for the epitaxial growth of GaN layers, either directly or via an intermediate epitaxial SiC layer. While large diameter silicon wafers are readily available, the growth of GaN films on buffer layers results in a high dislocation density which limits the use of such materials. Furthermore, cracking of the GaN film can result due to the extreme tensile stress induced by the silicon wafer on the GaN layer. The stress is a result of the different thermal expansion co-efficient of the silicon wafer and the GaN layer. If the stress is too large the wafer may even break during the epitaxial process. In addition, epitaxial growth of SiC has the disadvantage of generating many defects, particularly twins and hillocks.

It is also known to use silicon wafers as substrates for ion-beam synthesis of SiC (WO03/034484A2). In this approach, silicon wafers are implanted with carbon ions and annealed at high temperatures to produce a buried layer of SixCy below the silicon surface. The buried ion-beam synthesized SiC (IBS-SiC) layer has varying degrees of stoichiometry (x, y) and varying degrees of crystallinity without clearly defined borders to the top silicon layer and the bottom portion of the silicon substrate. The buried layer has no free surface and contains many SiC nano inclusions of different orientations, lattice defects, monocrystalline SiC regions, amorphous inclusions and end-of-range implantation damage. Under suitable implantation and annealing conditions a monocrystalline SiC region forms at a depth approximately corresponding to the mean depth of the implanted carbon ions. If the top silicon layer is removed GaN can be grown on the IBS-SiC layer. However, there is still the problem of cracking during GaN deposition due to the different thermal expansion coefficients of silicon and GaN.

The problem of cracking or wafer breakage during the epitaxial growth of the GaN layer can be solved by transferring a thin monocrystalline SiC layer to a base or handle wafer having a matching coefficient of thermal expansion, e.g. consisting of polycrystalline SiC. U.S. Pat. No. 6,328,796 discloses a method wherein a superficial 3c-SiC layer is produced by carbonizing the surface of a silicon donor wafer, bonding the SiC layer of the silicon donor wafer to a base wafer consisting of polycrystalline SiC and removing the rest of the silicon donor wafer in order to expose the SiC layer.

Carbonization of silicon substrates generates a large number of dislocations, stacking faults, voids and planar defects such as anti-phase boundaries (APBs). (Mendez et al., Materials Science Forum, Vols. 483-485 (2005), pp. 189-192) The large defect generation associated with carbonization is partially due to the large lattice mismatch between silicon and SiC (20%) and due to the coalescence of SiC islands which nucleate independently of each other with different phase and stacking orders, resulting in a high density of planar defects. (Zetterling et al., Process technology for SiC devices, EMIS Processing Series 2, ISBN 0852969988, Chapter 2, pp. 39-40) Furthermore, the C:Si ratio in the precursor gas needs to be tightly controlled during the carbonization process and the following SiC epitaxial growth in order to avoid additional defects. Epitaxial growth of SiC on the carbonized layer can reduce some of the crystal failures in the early growth phase due to self annihilation of some anti-phase boundaries, however, SiC growth is relatively slow (approximately 0.5-8 µm/hr) and the defect reduction is not very effective. Epitaxial growth will also roughen the surface due to step-like growth and nucleated defects which do not self-annihilate will continue to grow in the epitaxial process, and indeed some epitaxial related defects will in addition be nucleated and grow, for example stacking faults and growth hillocks. Furthermore, protrusions and macro-steps are an issue. (Takashi et al., Materials Science Forum, Vols. 389-393, (2002) pp. 323-326) The defect problems associated with a carbonization and a subsequent epitaxy step can be somewhat reduced with off-orientated crystals but the fundamental problems associated with SiC island coalescence and resulting twins and hillock growth remain. A further drawback of carbonization based epitaxial SiC growth on silicon is the generation of voids at the carbonized SiC/Si interface.

Finally, it has been discovered that if a GaN layer is deposited on the SiC layer and LEDs are fabricated on the GaN layer the efficiency of the LEDs is relatively low.

SUMMARY OF THE INVENTION

It is therefore the object of the present invention to provide a substrate for epitaxial growth of nitride containing layers which is free from the above-mentioned drawbacks and allows fabrication of high-quality devices, e.g. high-efficiency LEDs. These and other objects are achieved by a process wherein a silicon layer transferred onto a handle wafer is implanted with carbon and annealed to form monocrystalline SiC prior to or after the transfer of the donor layer. The remainder of the donor wafer is then removed.

BRIEF DESCRIPTION OF THE DRAWINGS

The present invention is described in detail with reference to FIGS. 1 to 7:

FIG. 4 depicts the process according to one embodiment of the present invention.

FIG. 6 depicts the process according to a yet further embodiment of the present invention.

DETAILED DESCRIPTION OF THE PREFERRED EMBODIMENTS

Figure 1:
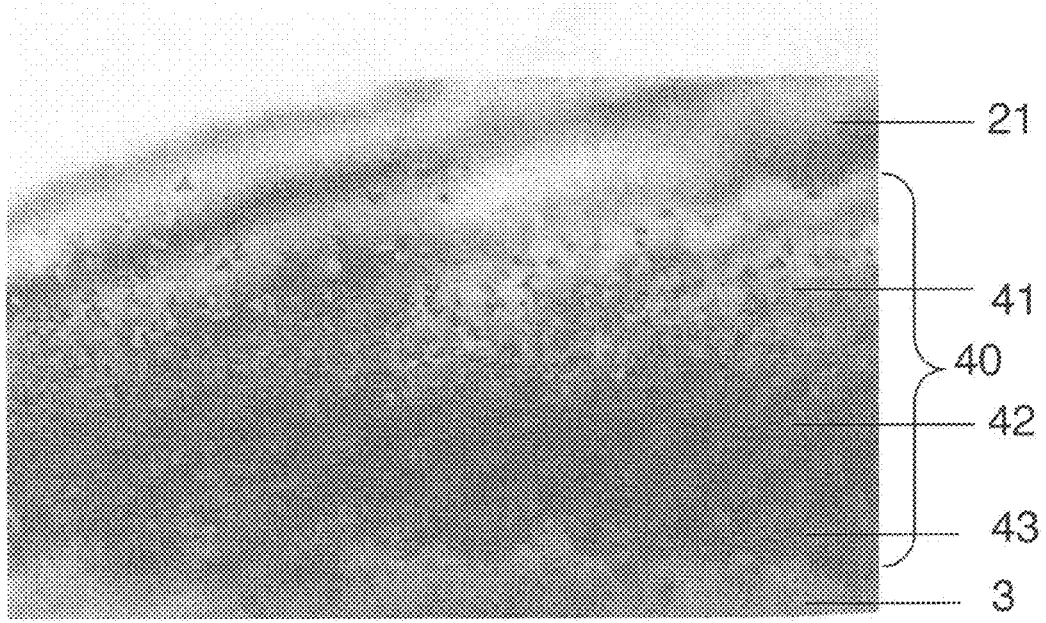
FIG. 1 shows the structure of a layer (40) comprising silicon carbide which has been formed in a silicon donor wafer (1). The figure is a TEM image of a vertical cross-section through the donor wafer.

The invention is thus directed to a process for manufacturing a multilayered semiconductor wafer comprising a handle wafer (5) and a silicon carbide donor layer (44) bonded to the handle wafer (5), the process comprising the steps of:
a) providing a handle wafer (5),
b) providing a donor wafer (1) comprising a donor layer (2) and a remainder (3) of the donor wafer, the donor layer (2) comprising monocrystalline silicon,
e) bonding the donor layer (2) of the donor wafer (1) to the handle wafer (5), and
f) removing the remainder (3) of the donor wafer in order to expose the donor layer (2) which remains bonded to the handle wafer (5), the process being characterized by further steps of
c) implanting carbon ions into the donor layer (2) in order to produce a layer (4) comprising implanted carbon, and
d) heat-treating the donor layer (2) comprising the layer (4) comprising implanted carbon in order to form a silicon carbide donor layer (44) in at least part of the donor layer (2).

In contrast to the process disclosed in U.S. Pat. No. 6,328, 796 the present invention uses the so-called "ion-beam synthesis" for the manufacture of the silicon carbide (SiC) donor layer (44). This layer is also referred to as an ion-beam synthesized silicon carbide (IBS-SiC) layer.

The invention also relates to a multilayered semiconductor wafer comprising a handle wafer (5) and a silicon carbide donor layer (44) which is bonded to the handle wafer (5), wherein the silicon carbide donor layer (44) is free of twins and free of additional silicon carbide polytypes, as determined by X-ray diffraction.

The invention further relates to a multilayered semiconductor wafer comprising a handle wafer (5) and a silicon carbide donor layer (44) which is bonded to the handle wafer (5), wherein the silicon carbide donor layer (44) comprises at least one varying carbon concentration zone (41, 43) in which the concentration of carbon atoms varies in a direction normal to the interfaces of the layer (44).

LIST OF REFERENCE NUMERALS 1 donor wafer
15 bond interface
2 donor layer
21 superficial layer of the donor wafer
3 remainder of the donor wafer
31 rest of the remainder of the donor wafer
4 layer comprising implanted carbon
40 layer comprising silicon carbide
41 upper varying carbon concentration zone
42 monocrystalline silicon carbide zone
43 lower varying carbon concentration zone
44 silicon carbide donor layer
5 handle wafer
6 epitaxial layer The following paragraphs describe all single steps of the process that are common to all embodiments of the invention whereas the most useful ways to combine these steps are described below in the section "Preferred embodiments".

Step a)

In step a) of the process according to the present invention (FIGS. 4-7) a handle wafer (5) is provided. The handle wafer is preferably chosen to improve device performance and/or epitaxial growth on the transferred IBS-SiC layer. For example the thermal expansion properties of silicon make it difficult to grow crack free GaN on silicon. Using a handle wafer consisting of a material such as polycrystalline SiC or sapphire allow better thermal expansion matching during epitaxial growth and crack free GaN can be grown. Ideally the handle wafer is available in all diameters and is relatively inexpensive. The handle wafer can be monocrystalline, polycrystalline or amorphous. One ideal handle wafer for the growth of GaN on a transferred IBS-SiC layer consists of polycrystalline SiC. These handle wafers are available in all diameters and at a much lower cost than small diameter monocrystalline SiC wafers. The thermal and electrical conductivity of the handle wafers can be chosen to be compatible with monocrystalline SiC. One particularly low cost approach to making bulk SiC is through the sintering process, and wafer cost is similar or less than that of equivalent silicon wafers and far less than monocrystalline SiC. The handle wafer is not limited to sapphire or SiC and can be chosen from any material with suitable thermal expansion properties for epitaxial growth and with suitable thermal and electrical conductivity. For applications with nitride containing epitaxial growth polycrystalline SiC wafers are preferred. Polycrystalline SiC also has a thermal expansion co-efficient which is close enough to that of GaN to prevent cracking of the GaN layer during epitaxial deposition on an IBS-SiC layer transferred to the handle wafer.

The handle wafer should have a warp value which is low enough to allow wafer bonding, preferably $\leqq 20$ μm. The chosen handle wafer may also have some porosity which is typical for sintered ceramics. Typically the thickness of commercially available wafers is larger than 200 μm and less than 1500 μm although other thickness values are also possible.

Step b)

In step b) of the process according to the present invention (FIG. 4-7) a donor wafer (1) is provided. The donor wafer (1) comprises at its front side a donor layer (2) which will subsequently be bonded to the handle wafer (5). The donor layer (2) is defined as the layer that will remain bonded to the handle wafer (5) when the remainder (3) of the donor wafer is removed in step f). As the case may be, the donor layer (2) may comprise monocrystalline silicon or a layer (4) comprising implanted carbon or a silicon carbide donor layer (44). The layer (4) comprising implanted carbon is produced in step c) by implantation of carbon ions into a donor layer (2) comprising monocrystalline silicon. The silicon carbide donor layer (44) is produced in step d) by heat-treating a donor wafer comprising such layer (4) comprising implanted carbon.

The donor wafer (1)—prior to carbon ion implantation and heat treatment—always comprises a donor layer (2) comprising, or consisting of, monocrystalline silicon. The remainder (3) of the donor wafer only supports the donor layer (2) and is therefore not subject to any substantial restrictions. The donor wafer (1) is preferably a monocrystalline silicon wafer. The orientation of the donor layer (2) or the whole donor wafer (1) is not important for the formation of layer (40) comprising silicon carbide, at least part of which forms the silicon carbide donor layer (44). The orientation has advantages for later epitaxial growth of hexagonally orientated crystals such as gallium nitride (GaN) and the <111> orientation is preferred, however, not mandatory. Both Czochralski (CZ) and Float-Zone (FZ) grown monocrystalline silicon may constitute the donor layer (2) or the whole donor wafer (1). In case the donor wafer (1) is not a monocrystalline silicon wafer, it may be a composite substrate having only a donor layer (2) comprising, or consisting of, monocrystalline silicon. For example, the donor wafer (1) could also be a wafer comprising a donor layer (2) of epitaxially grown silicon or an annealed wafer comprising a donor layer (2) having a reduced defect density due to the anneal. One major advantage of the current method is that silicon wafers are relatively inexpensive, have very low defectivity and are currently available in all diameters from 50 mm to 300 mm. The implantation of carbon ions is also possible for all these diameters so the possibility exists to manufacture a silicon carbide donor layer (44) on silicon wafers with any diameter.

The donor wafer should have a warp value which is low enough to allow wafer bonding, preferably less than 20 μm in case of a silicon wafer with a diameter of 100 mm and less than 60 μm in case of a silicon wafer with a diameter of 200 mm.

Further Options for Handle and Donor Wafers

The surfaces of both the handle wafer and the donor wafer should be polished to an extent which is adequate for wafer bonding, typically to a roughness of ≦1 nm RMS measured by AFM on an area of 1 μm×1 μm. Chemical-mechanical polishing (CMP) is a typical method to smoothen substrates and layers and is available for most semiconductor compatible materials.

Additional layers can be made on either the handle or donor wafer or both prior to polishing and bonding. This may be achieved by deposition of a thin layer such as silicon oxide ($SiO_2$), polycrystalline silicon, SiC or silicon nitride. In general these deposited layers are easier to smoothen than the monocrystalline silicon carbide (42) or a polycrystalline SiC handle wafer (5). This thin layer can then be polished to allow bonding. The choice of material may depend on the specific application and smoothening process. For devices requiring highly conducting substrates, conducting layers are preferred, for insulating substrates, insulating layers are preferred. For example polycrystalline silicon can be a good thermal and electrical insulator and can be smoothened with conventional silicon technology. Alternatively polycrystalline silicon can be doped to be a good electrical conductor. Silicon oxide is an insulator and can be smoothened with conventional chemical-mechanical polishing (CMP). SiC is more difficult to deposit and more difficult to smoothen. The deposited material must also be compatible with further device processing, in particular epitaxial deposition of nitride containing layers and LED manufacture or electronic devices such a HEMT (high electron mobility transistor) devices or microwave or power devices.

Using a polycrystalline SiC or a ceramic substrate as a handle wafer can avoid excess thermal stress during subsequent epitaxial deposition. However, these ceramic wafers are often manufactured in a sintering process which causes a relatively high porosity, rough surfaces and a high content of metals. Therefore, it may also be desirable to seal the handle wafer with a suitable material, as this can prevent metallic contamination out-diffusing from the bulk material. This also has the advantage of sealing any possible open pores on the surface material, e.g. on the surface of a sintered polycrystalline SiC wafer. The sealing layer may be optionally polished to achieve good bonding quality. Typical sealing layers are polycrystalline SiC, polycrystalline silicon, silicon oxide or silicon nitride.

It is also possible to include a light reflecting layer on the surface of either or both donor wafer and handle wafer. Such a light reflecting layer can be used in LED devices to reflect light. The light reflecting layer is preferably a metal and can also be polished to allow bonding. If a heat treatment at a high temperature will follow later on, metals with very high melting points are preferred. Such metals are, e.g., iridium, zirconium, titanium and platinum. For heat treatments below 1000° C. gold, silver and copper may also be used. The choice of metal will depend on the device process and influence of metals on the device characteristics.

The light reflecting layer can be a separate sealing layer or in combination with other sealing layers. The light reflecting layer can also be CMP polished if required. In the case of using an additional sealing layer with a light reflecting layer either layer can be on the surface of the donor or handle wafer.

Step c)

In step c) of the process according to the present invention (FIG. 4-7) carbon ions are implanted into the donor layer (2) in order to form a layer (4) comprising implanted carbon. This step can be performed on the donor wafer (1) prior to bonding it to the handle wafer (5) in step e) or on the donor layer (2) which has been transferred to the handle wafer (5) in steps e) and f).

As disclosed in WO03/034484A2 ion beam synthesized silicon carbide (IBS-SiC) layers can be manufactured on large diameter silicon substrates. In this method carbon ions are implanted at high energy into a monocrystalline silicon wafer to define a layer (4) comprising implanted carbon. Subsequently the wafer is heat-treated (annealed) (cf. step d) of the process according to the invention) at high temperature to generate a buried layer (40) comprising silicon carbide, also referred to as an IBS-SiC layer. The structural properties of the layer (4) comprising implanted carbon depend on the implantation energy, dose and implantation temperature. A detailed review of the influence of implantation temperature, dose, energy and annealing conditions on the post implant and post anneal structure is given by J. K. N. Lindner, "Silicon Carbide—Recent major Advances", pp. 251-266, ISBN 3-540-40458-9, Springer Verlag, August 2004.

The carbon concentration after implantation is a function of depth and can be controlled by the ion implantation energy and dose. The concentration depth profile of implanted carbon atoms is approximately Gaussian for a single implant energy. The layer (4) comprising implanted carbon contains many defects related to interstitial silicon atoms such as stacking faults and dislocation loops.

Typically, the implantation temperature is chosen to be 100° C. to 900° C., preferably 200° C. to 700° C. and most preferably 400° C. to 600° C. Typically, the implantation dose is between 2E17 to 1E18 atoms/cm$^2$. The implantation energy is 50 keV to some MeV, preferably 50 keV to 300 keV. The angle between the normal to the surface and the ion beam (tilt) can also be varied and is typically 0° to 10°.

Multiple implants with different implant energies are also possible to form a non-Gaussian carbon implanted zone.

Optionally, a layer can be deposited on the silicon wafer surface prior to implantation. This layer prevents sputtering of the silicon surface and also protects the surface from unintentional metal and particle contamination. Typical layers are, but not limited to, silicon oxide or silicon nitride. The layer can be optionally removed after the implantation or anneal.

Step d)

In step d) (FIG. 4-7) the donor layer (2) comprising the layer (4) comprising implanted carbon is heat-treated in order to form a layer (40) comprising silicon carbide in at least part of the donor layer (2).

Depending on implantation energy, implantation temperature, implantation dose (step c)) and annealing temperature, an ion beam synthesized silicon carbide (IBS-SiC) layer (40) can be formed (J. K. N. Lindner, "Silicon Carbide—Recent major Advances", pp. 251-266, ISBN 3-540-40458-9, Springer Verlag, August 2004).

The anneal temperature is typically 1150° C. to 1410° C. for 1 to 20 hours, preferably 1200° C. to 1350° C. for 2 to 15 hours. The heat treatment is typically performed as a batch process in a high temperature anneal furnace.

By ion implantation and anneal, a buried, ion-beam synthesized layer (40) comprising silicon carbide can be formed. This layer typically comprises a monocrystalline silicon carbide zone (42), an upper varying carbon concentration zone (41) and a lower varying carbon concentration zone (43).

In case of a donor wafer (1), at least the donor layer which consists of monocrystalline silicon (or alternatively a donor wafer (1) essentially consisting of monocrystalline silicon as a whole) the multilayer structure as shown in the transmission electron microscope (TEM) image in FIG. 1 is formed. The superficial layer (21) of the donor wafer consists of monocrystalline silicon which merges into a layer (40) comprising silicon carbide which merges with the bulk silicon of the remainder (3) of the donor wafer. The layer (40) comprising silicon carbide typically comprises an upper varying carbon concentration zone (41), which merges with a monocrystalline silicon carbide zone (42) which merges with a lower varying carbon concentration zone (43). In general, not all the interfaces between the merging layers or zones are sharp (cf. FIG. 1) as is typical in an epitaxial grown layer or CVD deposited layer, due to the tails of the Gaussian profile of the carbon ion implantation.

The monocrystalline silicon carbide zone (42) is well orientated and has a 3c crystal structure. The layer contains only the 3c polytype as measured by X-ray diffraction (XRD). A large number of planar defects and dislocations are present as measured with transmission electron microscopy (TEM). The layer showed no twins, which are typical for epitaxial grown SiC layers as observed in XRD measurements. No micropipes were observed per scanning electron microscopy. The layer also was free of large voids (>150 nm) which are typically found in carbonized SiC layers and can be observed with high resolution TEM.

The carbon concentration in the upper varying carbon concentration zone (41) is graded from the top part of the zone merging with the silicon of the superficial layer (21) of the donor wafer to the lower part of the zone merging with the monocrystalline silicon carbide zone (42). For preferred implant conditions at 400° C., the upper varying carbon concentration zone (41) has a central amorphous region and at 600° C. its central region contains many mis-orientated 3c-SiC nano-inclusions and SiC clusters. The top part of the upper varying carbon concentration zone (41) has a predominately monocrystalline silicon structure, whereas in its lower part a monocrystalline 3c-SiC structure is dominant. The crystalline portions of the upper varying carbon concentration zone (41) have a large number of extended lattice defects, >1E5/cm$^2$ as measured with TEM, resulting from the ion implantation damage. The structure of the upper damage layer is determined with TEM and XRD analysis.

The carbon concentration in the lower varying carbon concentration zone (43) is graded from the top part of the zone merging with the monocrystalline silicon carbide zone (42) to the lower part of the zone merging with the bulk silicon of the remainder (3) of the donor wafer. For preferred implant conditions at 400° C., the lower varying carbon concentration zone (43) has a central amorphous region and at 600° C., its central region contains many SiC clusters. The top part of the lower varying carbon concentration zone (43) has a predominately 3c-SiC monocrystalline structure and in the lower part of the zone, a monocrystalline silicon structure is dominant. The crystalline portions of the lower varying carbon concentration zone (43) have a large number of extended lattice defects, >1E5/cm$^2$ as measured with TEM, resulting from the end-of-range ion implantation damage. The structure of the lower varying carbon concentration zone (43) is determined with TEM and XRD analysis.

The carbon concentration can be measured using SIMS or RBS (Rutherford Back-Scattering).

In the present invention the heat-treatment in step d) (FIGS. 4-7) can be performed immediately after ion implantation in step c) or the ion implantation is performed on the donor wafer (1) in step c), the donor wafer (1) is bonded to the handle wafer (5) in step e) and afterwards the heat-treatment of step d) is carried out.

As mentioned above the layer (4) comprising implanted carbon contains a large number of defects and even after heat-treatment the boundaries of the upper and lower varying carbon concentration zones, (41) and (43) respectively, are not sharp. Nevertheless, it surprisingly turned out that the quality of the monocrystalline SiC layer (42) bonded to the handle wafer (5) is superior to the quality of an SiC layer produced by carbonizing the surface of a monocrystalline silicon donor wafer and transferring the layer to a handle wafer according to U.S. Pat. No. 6,328,796B1, e.g. when LEDs are manufactured.

Step e)

The surface of the donor or handle wafer may be oxidized prior to bonding in step e). A thin layer of polycrystalline silicon or an amorphous layer may also be deposited on the handle or donor wafer prior to bonding in step e). The deposition of additional layers prior to bonding can be accompanied with an additional polishing step either before or after layer deposition.

In step e) the donor layer (2) of the donor wafer (1) can be bonded to the handle wafer (5) by anodic bonding, direct bonding or via a suitable adhesive layer. Before bonding, the surfaces of both wafers are preferably cleaned to remove particles and chemically prepare the surface for bonding. Bonding can be carried out at room temperature or at elevated temperatures. Bonding strength can be enhanced by activating the surfaces of one or both wafers with a plasma prior to bonding. Direct wafer bonding is preferred as this is the more straightforward process. Following bonding, a heat-treatment (known as "bond anneal") is preferred to strengthen the bond to allow further processing. A bond anneal at temperatures of 1000° C. to 1200° C. for 2 hours or more is typical. If the bonding process had a plasma activation prior to bonding, then lower temperatures would also be possible, for example 1 to 10 hours at 400° C. to 800° C. The bond anneal can be performed immediately after bonding or at any time after the subsequent steps of the process.

Step f)

In step f) (FIG. 4-7) the donor layer (2) (in preferred embodiments 1-3 the silicon carbide donor layer (44), in preferred embodiment 4 the monocrystalline silicon donor layer) is exposed by removing the remainder (3) of the donor wafer. The remainder (3) of the donor wafer typically comprises a portion of the layer (40) comprising silicon carbide, whereas the rest of the layer (40) comprising silicon carbide is part of the donor layer (2). This overlapping part is referred to as the silicon carbide donor layer (44). More specifically, the remainder (3) of the donor wafer may comprise, as the case may be, a portion or all of the lower varying carbon concentration zone (43) and a portion or all of the monocrystalline silicon carbide zone (42). The silicon carbide donor layer (44) comprises at least a portion of either the upper varying carbon concentration zone (41) or the monocrystalline silicon carbide zone (42) or the lower varying carbon concentration zone (43). Preferably, however, at least part of the monocrystalline silicon carbide zone (42) is part of the donor layer (2) and thus of the silicon carbide donor layer (44).

The remainder (3) of the donor wafer is removed via grinding or selective etching or polishing of the donor wafer (1) from its back side that is not bonded to the handle wafer (5), or a combination thereof. One method of exposing the donor layer (2) is to grind the donor wafer (1) from its back side. The rest of the remainder (3) of the donor wafer can be removed via chemical etching, thermal oxidation and subsequent oxide removal, polishing or a combination of these. The exposed donor layer (2) may be smoothened, e.g. using polishing, preferably CMP. The surface of the exposed silicon carbide donor layer (44) (preferred embodiments 1-3) is predominantly crystalline SiC. Preferably more than 90% of the surface consist of crystalline SiC as measured with XRD. The crystallinity can also be measured with high resolution TEM, or photo-luminescence, or any other method sensitive to the crystalline surface structure such as different growth rates of an epitaxial layer deposited on the surface with subsequent thickness measurement.

Optional Step h)

Figure 2:
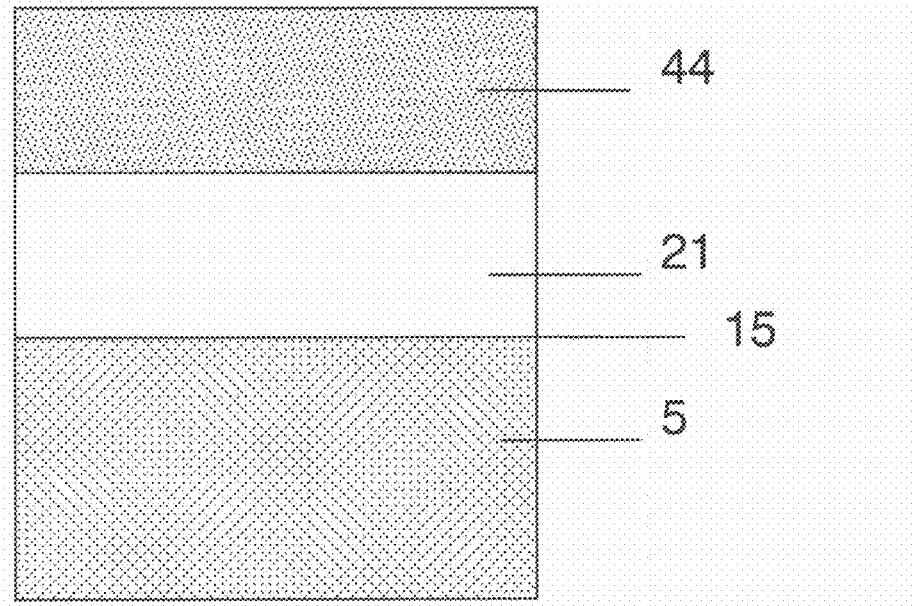
FIG. 2 schematically shows the structure of a multilayered semiconductor wafer according to the invention.

After completion of the steps (FIG. 4-7) of carbon ion implantation into the donor layer (2), heat-treatment in order to form a layer (40) comprising silicon carbide in at least part of the donor layer (2), bonding and exposing the silicon carbide donor layer (44) by removal of the remainder (3) of the donor wafer (regardless of the sequence of these steps) the bonded handle wafer (5) and donor wafer (1) exhibit the following structure as shown in FIG. 2:

The handle wafer (5) is bonded to the silicon carbide donor layer (44) either directly or via one or more additional layers like a remaining superficial layer (21) of the donor wafer. In case of the fourth embodiment of the present invention (FIG. 7), the silicon carbide donor layer (44) may be covered by a superficial layer (21) and the upper varying carbon concentration zone (41) of the donor wafer. The additional layers and at least a portion of the upper varying carbon concentration zone (41) covering the silicon carbide donor layer (44) are removed according to the fourth embodiment of the present invention in order to expose the silicon carbide donor layer (44). In the fourth embodiment the upper varying carbon concentration zone (41) can also be completely removed and in addition a portion of the monocrystalline silicon carbide zone (42) can be removed to expose the silicon carbide donor layer (44).

The exposed surface of the silicon carbide donor layer (44) may not be smooth enough to grow an epitaxial layer thereon. In this case, the surface of the silicon carbide donor layer (44) is smoothened in an optional step h) to allow epitaxial growth on the surface. Polishing and especially CMP is particularly effective in smoothening this layer. Upon polishing, a highly smoothened ($\leq$1 nm, preferably 0.5 nm RMS measured with AFM on a 1×1 μm site) surface of the silicon carbide donor layer (44) remains. The silicon carbide donor layer (44) is very thin, typically less than 300 nm. Therefore typical SiC polishing with high removal rates should be avoided.

The obtained smooth surface of the silicon carbide donor layer (44) is adequate for growth of an epitaxial layer (6).

Description of the Multilayered Semiconductor Wafer According to the Invention

The process results in a multilayered semiconductor wafer (FIG. 2) comprising a handle wafer (5) and a silicon carbide donor layer (44) which is bonded to the handle wafer (5), either directly or via one or more interposed layers. The silicon carbide donor layer (44) is an ion-beam synthesized SiC layer. Due to its production it is free of twins and free of additional silicon carbide polytypes, both determined by X-ray diffraction. Preferably, the silicon carbide donor layer (44) has a 3c crystal structure and is also free of micropipes as determined by scanning electron microscopy.

The silicon carbide donor layer (44) has the same structure as described above under steps d) and f). It can comprise (see also FIG. 1) one or more of an upper varying carbon concentration zone (41), a monocrystalline silicon carbide zone (42) and a lower varying carbon concentration zone (43). Preferably, the surface of the silicon carbide donor layer (44) has an interface that is not bonded to the handle wafer (5) which consists of at least 90% crystalline silicon carbide. Also preferably, the silicon carbide donor layer (44) comprises a monocrystalline silicon carbide zone (42). In this case it may additionally comprise at least one varying carbon concentration zone (41, 43) in which the concentration of carbon atoms varies in a direction normal to the interfaces of the layer (44). The silicon carbide donor layer (44) preferably has a thickness of 2 nm to 800 nm, most preferably 15 nm to 300 nm.

Preferably, there is at least one interposed layer between the handle wafer (5) and the silicon carbide donor layer (44), the interposed layer being selected from the group of insulating, reflecting or sealing layers. The function of these layers has been described above. Preferably, the multilayered semiconductor wafer also comprises an additional layer (21) consisting of monocrystalline silicon which is interposed between the handle wafer (5) and the silicon carbide donor layer (44). Insulating layers can comprise silicon oxide or silicon nitride, reflecting layers can comprise metals and sealing layers can comprise polycrystalline silicon, silicon oxide or silicon nitride. The function of these layers was described above under section "Further options for handle and donor wafers".

The multilayered semiconductor wafer according to the invention preferably has a diameter of more than 100 mm and up to 300 mm or even 450 mm.

In addition to matching the thermal expansion coefficients, a compliant layer or a stress relieving layer may also be comprised in the composite structure. Preferably the superficial layer (21) of the donor wafer consisting of silicon is used a stress relieving layer. During epitaxial growth of epitaxial layers containing nitride at 1000° C., dislocation loops are generated in the silicon, which help to relieve stress in the nitride containing layer and hence avoid cracking.

The handle wafer has been described above (cf. step a)). Epitaxial layers containing nitride are used in many device applications. Light emitting diodes (LEDs) use epitaxial nitride containing layers to emit visible light. The material of the handle wafer (5) needs to be electrically conducting. SiC is ideal as this can be chosen to be either insulating or conducting depending on the doping type and concentration.

In general, vertical current conducting devices will need a conducting substrate. In lateral conducting devices it may be advantageous to have an insulating substrate. This can be achieved by using non-doped SiC as a handle wafer (5) or inserting an insulating layer between the silicon carbide donor layer (44) and the handle wafer (5). Insulating layers such as silicon oxide and silicon nitride are typical. Depending on the device requirements insulating or conducting substrates may be used. Typical devices are high electron mobility transistors, microwave power devices and vertical conducting power devices.

The exposed silicon carbide donor layer (44) may also be used for epitaxial growth of SiC. In this case the handle wafer (5) is typically silicon or non-monocrystalline SiC, whereby polycrystalline SiC is preferred. Devices which are normally produced on bulk monocrystalline SiC are now produced in the epitaxial layer and with a polycrystalline SiC handle wafer (5). The electrical conductivity of the epitaxial SiC layer and the polycrystalline SiC are chosen by suitable doping.

It is also preferable to transfer and further process the silicon carbide donor layer (44) to act as a heat dissipating layer beneath the buried oxide layer of an SOI wafer.

In the manufacture of nitride based electronic devices on SiC, it is advantageous to keep metallic impurities away from the active device regions, as these metals may interfere with device processing and negatively impact device performance, e.g. unwanted metal contamination can form recombination centers which can disturb carrier lifetime in electrical devices and provide unwanted radiative recombination centers in optoelectronic devices. This may be achieved by using one of the above-mentioned sealing layers. However, also the silicon carbide donor layer (44) can getter unwanted metals. In addition, the silicon carbide donor layer (44) will also act as a diffusion barrier to metals, so that metallic contamination from the bulk region will not enter the device region.

A further disadvantage of using only monocrystalline layers for hetero-epitaxial growth is that stress can only be absorbed in the monocrystalline layers generating additional stress induced crystal defects in the epitaxial layer, and under high stress, cracks occur. Intermediate layers, placed between the substrate and the epitaxial layer, which can plastically deform during epitaxial growth, can prove beneficial in reducing stress induced crystal defects and prevent cracking of the epitaxial layer. Such intermediate layers could be amorphous layers, porous layers or dislocation rich layers or a silicon rich region comprising extended crystal defects, ion implantation damage, amorphous regions and inclusion of SiC crystallite inclusions or a mixture thereof. If a thin superficial layer (21) of the donor wafer, e.g. an ultra-thin monocrystalline silicon layer, or a varying carbon concentration zone (41, 43) or both remain between the bond interface (15) and the monocrystalline silicon carbide zone (42), then additional stress relieving is possible, as the additional layers can elastically and plastically deform during epitaxial growth on the exposed silicon carbide donor layer (44). This can help prevent cracking of the GaN layer during epitaxial growth. Optional Step i)

Figure 3:
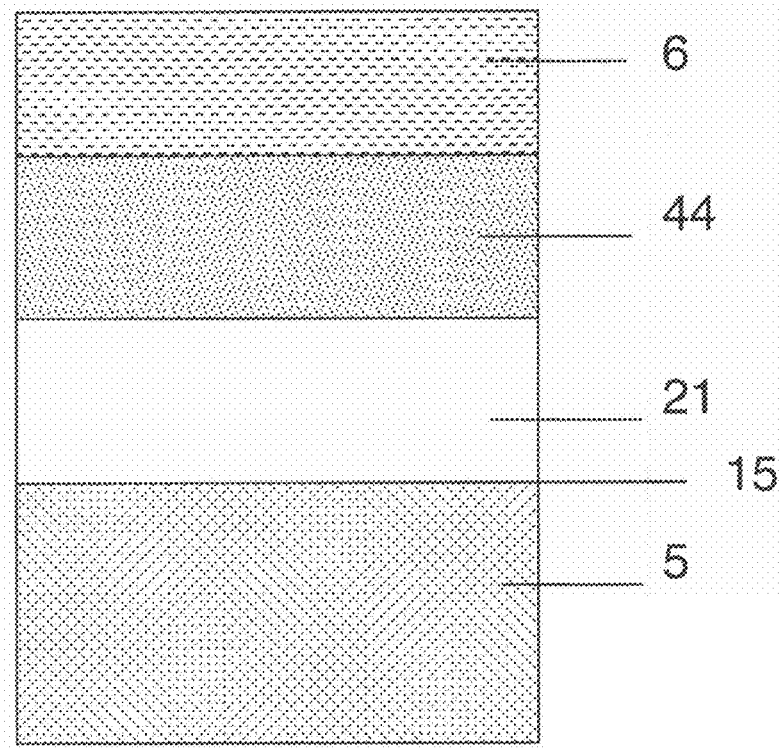
FIG. 3 schematically shows the multilayered semiconductor wafer of FIG. 2 which bears an additional epitaxial layer.

The exposed surface of the silicon carbide donor layer (44) can be used for homo-epitaxial growth of silicon carbide or hetero-epitaxial growth of other semiconductor materials. (FIGS. 3, 4. Step i) is only illustrated in FIG. 4, although the epitaxial growth of a layer is of course also possible on the exposed silicon carbide donor layer (44) according to the second to fourth preferred embodiments of the invention.) In particular the exposed surface can be used to grow crystalline epitaxial layers consisting of nitride materials like gallium nitride (GaN), aluminum nitride (AlN), indium nitride (InN), gallium aluminum nitride (GaAlN) or gallium indium nitride (GaInN).

Epitaxial growth of nitride containing layers can be performed with either molecular beam Epitaxy (MBE) or metal organic chemical vapor deposition (MOCVD). MBE processes are generally at lower temperatures $\leq 700°$ C. The MOCVD processes are typically at temperatures above 900° C. The higher the epitaxial process temperature, the closer the thermal expansion co-efficient between the epitaxial layer and the substrate needs to be matched.

The epitaxial layers (6) to be grown on the surface of the silicon carbide donor layer (44) are the same as those which may be grown on monocrystalline SiC wafers. The growth of GaN can occur with or without buffer layers. Typical buffer layers are low temperature GaN or AlN. The advantage of this composite substrate is that conventional III-V epitaxial growth can be performed on large diameter pseudo-SiC substrates without major modifications to the growth process. Epitaxial growth of zinc oxide (ZnO), cadmium oxide (CdO) or magnesium oxide (MgO) is also possible. The wafer is compatible to MBE, MOVPE and MOCVD growth processes. Defects arising from twins and polytypes in the SiC donor layer can be avoided, particularly if the exposed surface of the silicon carbide donor layer (44) is from the monocrystalline silicon carbide zone (42).

The growth of epitaxial layers containing nitride can also occur on the upper and lower varying carbon concentration zones (41) and (43) if a high portion (>90%) of the exposed surface is crystalline SiC. While the structure of the resulting epitaxial layer is inferior to growing nitride epitaxy on the monocrystalline silicon carbide zone (42), the epitaxial layer can still be used in optoelectronic devices, particularly light emitting diodes. Such epitaxial layers containing nitride grown on one of the varying carbon concentration zones (41, 43) are particularly useful, if the resulting defects in the epitaxial layers containing nitride still allow optical emissions. The optical emissions may also include a shifted band of wavelengths different to the peak emission, which leads to a broader emission spectrum of the optical device. A similar effect is possible for epitaxial layers of ZnO, CdO and MgO.

The invention solves the problem of low efficiency of LEDs manufactured on carbonized SiC layers. Carbonized SiC layers contain considerable amounts of twins. Existing twins cannot be annealed. They grow further into a gallium nitride (GaN) layer which is epitaxially deposited on the SiC layer. When the GaN layer is used to fabricate LEDs, the twins act as non-radiative recombination centers for electrons and thus degrade the efficiency of the LEDs. The IBS-SiC layer according to the invention does not contain twins. Due to the absence of twins, the efficiency of LEDs fabricated on a GaN layer which has been grown on the IBS-SiC is increased.

Preferred Embodiment 1

Several variations in the process flow are possible and some are illustrated in the following preferred embodiments. Additional steps are also possible.

In a first preferred embodiment (FIG. 4) the process according to the invention comprises the following steps in the given order:
a) providing a handle wafer (5),
b) providing a donor wafer (1) comprising a donor layer (2) and a remainder (3) of the donor wafer, the donor layer (2) comprising monocrystalline silicon,
c) implanting carbon ions into the donor layer (2) in order to produce a layer (4) comprising implanted carbon,
d) heat-treating the donor wafer (1) comprising the layer (4) comprising implanted carbon in order to form a layer (40) comprising silicon carbide which at least overlaps with the donor layer (2), the overlapping part forming the silicon carbide donor layer (44), the silicon carbide donor layer (44) being covered by a superficial layer (21) comprising monocrystalline silicon which is situated at the surface of the donor layer (2),
e) bonding the donor layer (2) of the donor wafer (1) to the handle wafer (5), and
f) removing the remainder (3) of the donor wafer in order to expose the silicon carbide donor layer (44) which remains bonded to the handle wafer (5).

In this preferred embodiment carbon ions are implanted into the donor layer (2) of a donor wafer (1) in step c). The heat-treatment in order to form a layer (40) comprising silicon carbide in step d) is performed prior to bonding the donor wafer (1) to the handle wafer (5) in step e).

After implantation of carbon ions in step c) the donor wafer (1) has the following structure, which is equal to the structure of the donor wafer (1) after step c) of the second and third preferred embodiments (FIGS. 5 and 6): The donor layer (2) comprises at least part of the layer (4) comprising implanted carbon. Typically, the layer (4) comprising implanted carbon is covered by a superficial layer (21) of the donor wafer consisting essentially of monocrystalline silicon in case the whole donor layer (2) consisted of monocrystalline silicon prior to ion implantation. The layer (4) comprising implanted carbon may overlap with the remainder (3) of the donor wafer or may be situated completely inside the donor layer (2) with the upper boundary of the layer (4) comprising implanted carbon being identical to the boundary between the donor layer (2) and the remainder (3) of the donor wafer.

It has to be noted that in many cases, e.g. in case of a monocrystalline silicon donor wafer (1), the donor layer (2) and the remainder (3) of the donor wafer cannot be structurally distinguished. In these cases the "remainder (3) of the donor wafer" is merely defined by the amount of material that will be removed in step f).

After heat-treatment in step d) the donor wafer (1) has the following structure: The donor layer (2) comprises at least part of the layer (40) comprising silicon carbide, this part being referred to as the silicon carbide donor layer (44). The silicon carbide donor layer (44) may comprise, partially or as a whole, one or more of an upper varying carbon concentration zone (41), a monocrystalline silicon carbide zone (42) and a lower varying carbon concentration zone (43) as described above. Typically, the silicon carbide donor layer (44) is covered by a superficial layer (21) of the donor wafer consisting essentially of monocrystalline silicon in case the whole donor layer (2) consisted of monocrystalline silicon prior to ion implantation. The layer (40) comprising silicon carbide may overlap with the remainder (3) of the donor wafer or the boundary of the layer (40) comprising silicon carbide may coincide with the boundary between the donor layer (2) and the remainder (3) of the donor wafer. Typically the remainder (3) of the donor wafer comprises a portion or all of the lower varying carbon concentration zone (43).

One variation is to partially remove a superficial part of donor layer (2) and to smoothen the resulting surface to a level suitable for wafer bonding, preferably <1 nm RMS, prior to bonding the wafers in step e). The extent of the removal may be chosen to remove only the superficial layer (21) of the donor wafer, or to remove the upper varying carbon concentration zone (41), or to remove even part or all of the monocrystalline silicon carbide zone (42). As silicon carbide is not easy to smoothen, a layer of suitable material may be deposited on the resulting surface of the donor layer (2) before smoothening. For this purpose a material is selected which is easier to smoothen. Typical layers which may be deposited and smoothened are, e.g., silicon oxide, polycrystalline silicon, CVD SiC, high melting metals and silicon nitride. The material needs to be chosen so that it is compatible with the device type to be processed. Deposition of light reflecting layers, e.g. metal layers, prior to bonding may be advantageous for light emitting applications. Deposition of insulating layers such as silicon oxide or silicon nitride may be suitable for devices requiring insulating substrates. CMP is a typical method to smoothen substrates and layers and is available for most semiconductor compatible materials. If the Smart-cut process (cf. preferred embodiment 5) is applied in order to remove the remainder (3) of the donor wafer in step f) a hydrogen implantation is used prior to bonding to define the remainder (3) of the donor wafer to be removed after bonding.

The silicon carbide donor layer (44) does not necessarily need to be exposed before bonding. As the silicon carbide donor layer (44) is preferably less than 500 nm below the surface of the donor layer (2), it is also possible to bond the silicon superficial layer (21) of the donor wafer to the handle wafer (5). This has the advantage of reducing the number of process steps and the need to smoothen the exposed SiC surface via CMP, as the superficial layer (21) of the donor wafer is already polished. It is also possible to thin the superficial layer (21) of the donor wafer after implantation but before bonding. Thinning can be achieved by similar techniques needed to expose the silicon carbide donor layer (44). Thinning techniques include, but are not limited to, polishing, liquid or gaseous chemical etching and thermal oxidation with subsequent oxide removal.

The donor layer (2) of the donor wafer (1) is then bonded to the handle wafer (5) via bond interface (15). The bonded pair of wafers is then preferably annealed to strengthen the wafer bond, but this bond anneal does not necessarily take place immediately after bonding. The bond anneal may occur before or after exposing the silicon carbide donor layer (44) in step f).

The remainder (3) of the donor wafer is removed in step f) to expose the silicon carbide donor layer (44) to offer a surface for epitaxial growth. The biggest part of the remainder (3) of the donor wafer is preferably removed via grinding the donor wafer (1) from its back side to within some micrometers of the monocrystalline silicon carbide zone (42). The rest of the remainder (3) of the donor wafer can be removed via chemical etching, thermal oxidation and subsequent oxide removal, polishing or a combination of these. It is preferable to use selective etching with the layer (40) comprising silicon carbide acting as an etch stop. It may also prove advantageous to thermally oxidize and subsequently etch the silicon carbide surface in order to remove the lower varying carbon concentration zone (43) which may be present.

The exposed silicon carbide donor layer (44) may be smoothened in a further step h), e.g. using polishing, preferably CMP. After polishing a highly smoothened (roughness ≦0.5 nm RMS) exposed silicon carbide donor layer (44) remains. This surface is adequate for growth of epitaxial semiconductor layers.

In a further step i) an epitaxial layer (6), e.g. a nitride containing layer like GaN may be grown on the surface of the silicon carbide donor layer (44).

This embodiment has the advantage that during the high temperature anneal only hyperpure silicon wafers are used and the risk of contamination from the handle wafer due to impurity diffusions is limited. Furthermore, the layer (40) comprising silicon carbide is annealed only on the donor substrate and hence can be transferred to different donor wafers (1) allowing more flexibility in the process flow. It has the disadvantage of two separate anneals, i.e. the implantation anneal is independent of the bond anneal.

Preferred Embodiment 2

In a second preferred embodiment (FIG. 5) the process according to the invention comprises the following steps in the given order:
a) providing a handle wafer (5),
b) providing a donor wafer (1) comprising a donor layer (2) and a remainder (3) of the donor wafer, the donor layer (2) comprising monocrystalline silicon,
c) implanting carbon ions into the donor layer (2) in order to produce a layer (4) comprising implanted carbon, the layer (4) comprising implanted carbon being covered by a superficial layer (21) comprising monocrystalline silicon which is situated at the surface of the donor layer (2),
e) bonding the donor layer (2) of the donor wafer (1) to the handle wafer (5),
d) heat-treating the bonded handle wafer (5) and donor wafer (1) comprising the layer (4) comprising implanted carbon in order to form a layer (40) comprising silicon carbide which at least overlaps with the donor layer (2), the overlapping part forming the silicon carbide donor layer (44), and
f) removing the remainder (3) of the donor wafer in order to expose the silicon carbide donor layer (44) which remains bonded to the handle wafer (5).

In this preferred embodiment carbon ions are implanted into the donor layer (2) of a donor wafer (1) in step c). The heat-treatment in order to form a layer (40) comprising silicon carbide in step d) is performed after bonding the donor wafer (1) to the handle wafer (5) in step e).

After implantation of carbon ions in step c) the donor wafer (1) has the same structure as the donor wafer (1) after step c) of the first preferred embodiment. The donor layer (2) of the donor wafer (1) is then bonded to the handle wafer (5).

Figure 5:
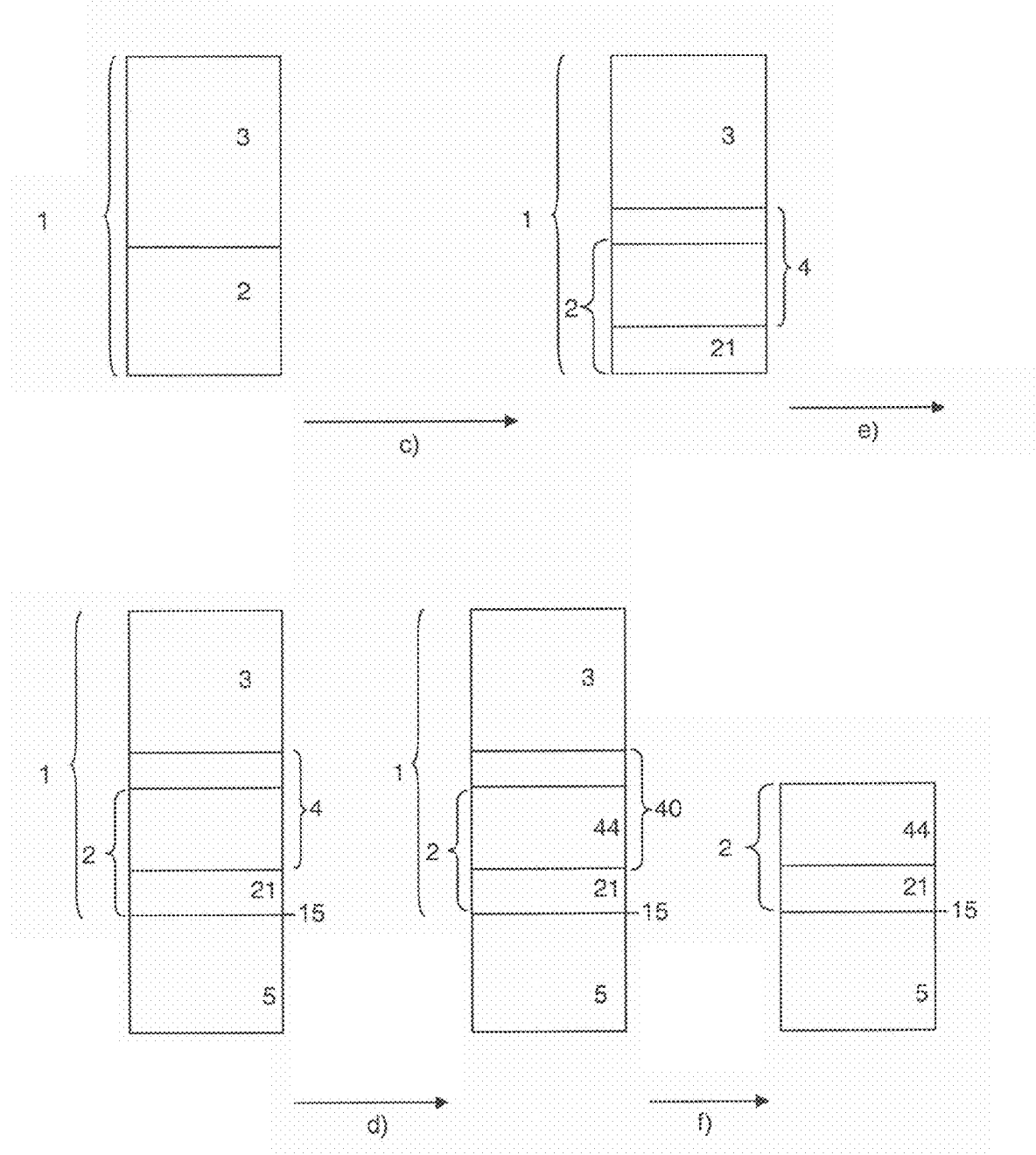
FIG. 5 depicts the process according to a further embodiment of the present invention.

After heat-treatment the donor wafer (1) has typically the same structure as after the heat-treatment of preferred embodiment 1, but its donor layer (2) is already bonded to the handle wafer (5) via bond interface (15) as shown in FIG. 5.

In a variation of this embodiment a process step or sequence of process steps which completely or partially remove the superficial layer (21) of the donor wafer and optionally a portion of the layer (4) comprising implanted carbon prior to bonding are also possible. The removal can be performed via polishing, chemical etching or thermal oxidation with subsequent oxide removal or a combination thereof. Removal of the superficial layer (21) of the donor wafer and optionally of a portion of the layer (4) comprising implanted carbon has the advantage that no monocrystalline silicon is included in the final structure which completely eliminates thermal expansion mismatch due to monocrystalline silicon during subsequent device processing. The exposed surface may be optionally smoothened with CMP and include an optional light reflecting layer or insulating layer.

The bonded pair of wafers is then preferably annealed to strengthen the wafer bond, but this bond anneal does not necessarily take place immediately after bonding. The bond anneal may occur before or after exposing the silicon carbide donor layer (44) step f).

The further step f) as well as the optional steps h) and i) may be performed as described for the first preferred embodiment.

This embodiment has the advantage that the bond anneal and donor anneal may be combined and reduce the number of process steps. The thermal mismatch between the thick donor and handle wafers and the risk of contamination out-diffusion from the handle wafer can cause problems at higher temperatures. The risk of contamination from the handle wafer during the anneal can be eliminated by using either very pure handle wafers or using suitable sealing layers.

Preferred Embodiment 3

In a third preferred embodiment (FIG. 6) the process according to the invention comprises the following steps in the given order:
a) providing a handle wafer (5),
b) providing a donor wafer (1) comprising a donor layer (2) and a remainder (3) of the donor wafer, the donor layer (2) comprising monocrystalline silicon,
c) implanting carbon ions into the donor layer (2) in order to produce a layer (4) comprising implanted carbon, the layer (4) comprising implanted carbon being covered by a superficial layer (21) comprising monocrystalline silicon which is situated at the surface of the donor layer (2),
e) bonding the donor layer (2) of the donor wafer (1) to the handle wafer (5),
f) removing at least part of the remainder (3) of the donor wafer, the donor layer (2) remaining bonded to the handle wafer (5), and
d) heat-treating the bonded handle wafer (5) and donor layer (2) comprising the layer (4) comprising implanted carbon in order to form a layer (40) comprising silicon carbide which at least overlaps with the donor layer (2), the overlapping part forming the silicon carbide donor layer (44).

Following annealing in step d) a possibly remaining portion (31) of the donor wafer can be removed via chemical etching, polishing, thermal oxidation with subsequent oxide removal or a combination thereof.

In this preferred embodiment carbon ions are implanted into the donor layer (2) of a donor wafer (1) in step c). The heat-treatment in order to form a layer (40) comprising silicon carbide in step d) is performed after bonding the donor wafer (1) to the handle wafer (5) in step e) and removing at least a portion of the remainder (3) of the donor wafer in step f).

After implantation of carbon ions in step c) the donor wafer (1) has the same structure as the donor wafer (1) after step c) of the first preferred embodiment. The donor layer (2) of the donor wafer (1) is then bonded to the handle wafer (5) via bond interface (15).

In a variation of this embodiment a process step or sequence of process steps which completely or partially remove the superficial layer (21) of the donor wafer and optionally a portion of the layer (4) comprising implanted carbon prior to bonding are also possible. The removal can be performed via polishing, chemical etching or thermal oxidation with subsequent oxide removal or a combination thereof. Removal of the superficial layer (21) of the donor wafer and optionally of a portion of the layer (4) comprising implanted carbon has the advantage that no monocrystalline silicon is included in the final structure which completely eliminates thermal expansion mismatch due to monocrystalline silicon during subsequent device processing. The exposed surface may be optionally smoothened with CMP and include an optional light reflecting layer or insulating layer.

The bonded pair of wafers is then preferably annealed to strengthen the wafer bond, but this bond anneal does not necessarily take place immediately after bonding. The bond anneal may occur before or after removing at least part of the remainder (3) of the donor wafer in step f).

The removal of the remainder (3) of the donor wafer can only use the layer (40) comprising silicon carbide as an etch stop following high temperature annealing. In the case where the removal step f) occurs before annealing a small portion (31), typically several micrometers, of the remainder (3) of the donor wafer remains following a first removal step. The remaining small portion (31) of the remainder (3) of the donor wafer is then removed in a second removal step following high temperature annealing. This option can be useful if the stress associated with the different thermal expansion coefficients of the handle wafer (5) and donor wafer (1) becomes so large that defects are generated in the layer (4) comprising implanted carbon or in the superficial layer (21) of the donor wafer.

The optional steps h) and i) may be performed as described for the first preferred embodiment.

This embodiment eliminates the thermal expansion coefficient mismatch problems associated with thick donor and handle wafers in embodiment 2 while keeping the advantage of combining the implant anneal and the bond anneal. The risk of contamination from the handle wafer during the anneal can be eliminated by using either very pure handle wafers or using suitable sealing layers. Assuming that thermal mismatch limits the annealing temperature in embodiment 2, then this embodiment 3 allows a higher anneal temperature as the thick donor wafer is thinned (step f) prior to annealing (step d).

Preferred Embodiment 4

In a fourth preferred embodiment (FIG. 7) the process according to the invention comprises the following steps in the given order:
a) providing a handle wafer (5),
b) providing a donor wafer (1) comprising a donor layer (2) and a remainder (3) of the donor wafer, the donor layer (2) comprising monocrystalline silicon,
e) bonding the donor layer (2) of the donor wafer (1) to the handle wafer (5),
f) removing the remainder (3) of the donor wafer in order to expose the donor layer (2) which remains bonded to the handle wafer (5),
c) implanting carbon ions into the donor layer (2) in order to produce a layer (4) comprising implanted carbon,
d) heat-treating the bonded handle wafer (5) and donor layer (2) comprising the layer (4) comprising implanted carbon in order to form a layer (40) comprising silicon carbide which at least overlaps with the donor layer (2), the overlapping part forming the silicon carbide donor layer (44), the silicon carbide donor layer (44) being covered by a superficial layer (21) comprising monocrystalline silicon which is situated at the surface of the donor layer (2), and
g) removing at least the superficial layer (21) comprising monocrystalline silicon in order to expose the silicon carbide donor layer (44).

In this preferred embodiment carbon ions are implanted into the donor layer (2) after the donor layer (2) has been bonded to the handle wafer (5) in step e) and the remainder (3) of the donor wafer has been removed in step f). Subsequently the heat-treatment in order to form a layer (40) comprising silicon carbide in step d) is performed.

Figure 7:
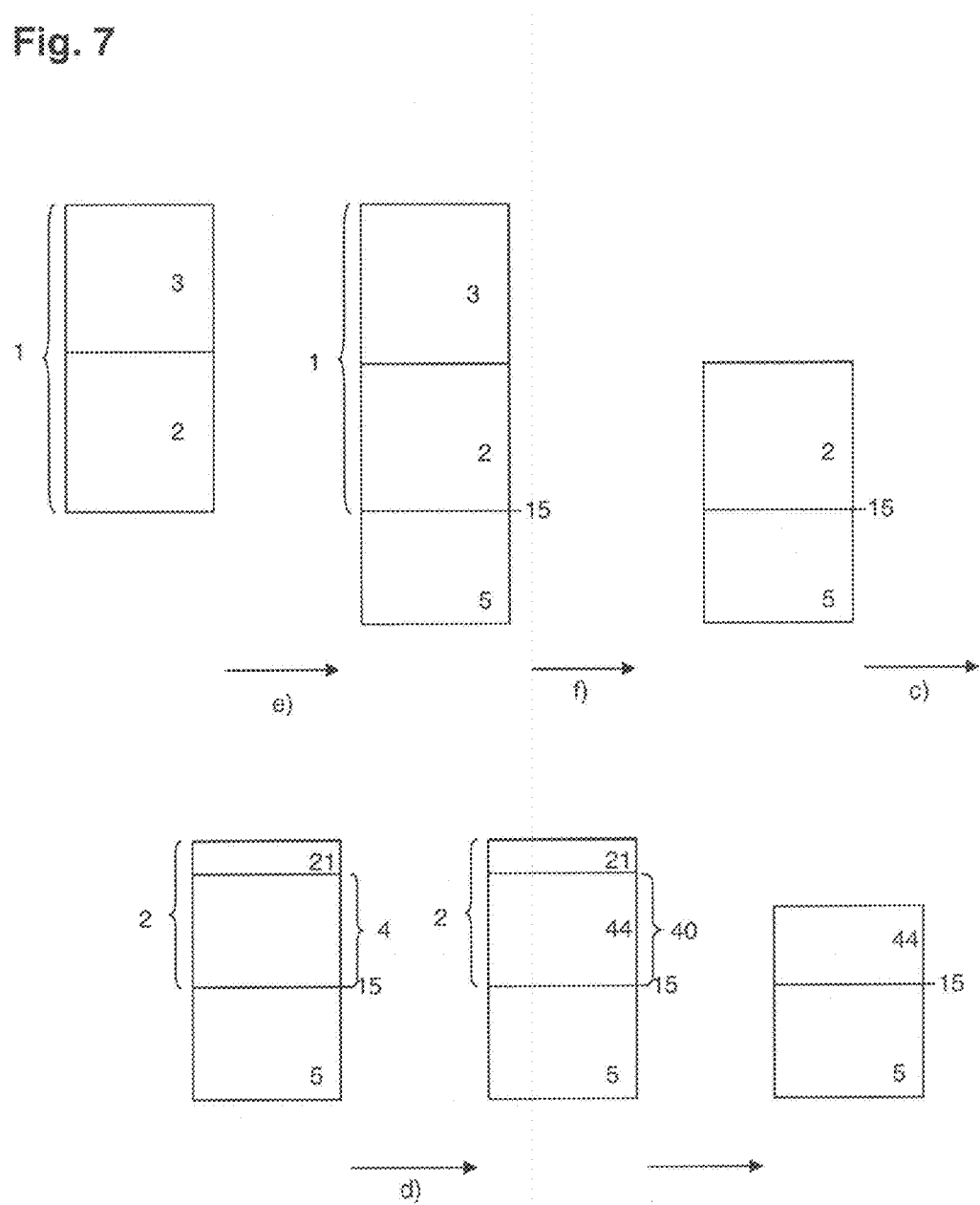
FIG. 7 depicts the process according to a still further embodiment of the present invention.

Bonding of the donor wafer (1) to the handle wafer (5) leads to a structure as depicted in FIG. 7: The handle wafer (5) is connected to the donor layer (2) via bond interface (15), and donor layer (2) is covered by the remainder (3) of the donor wafer. The donor layer (2) comprises monocrystalline silicon, but no implanted carbon. The bonded pair of wafers is then preferably annealed to strengthen the wafer bond, however, in the case of plasma activated bonding, the bonding strength is adequate for further processing and the bonding anneal step can be combined with the implant anneal of step d).

It has to be noted that in many cases, e.g. in case of a monocrystalline silicon donor wafer (1), the donor layer (2) and the remainder (3) of the donor wafer cannot be structurally distinguished. In these cases the "remainder (3) of the donor wafer" is merely defined by the amount of material that will be removed in step f).

Next, the remainder (3) of the donor wafer is removed in step f). This can be done mechanically via grinding or polishing or chemically via etching or a combination of mechanical and chemical treatment. Preferably step f) comprises a step of smoothening the surface of the donor layer (2) via CMP polishing.

Before implanting carbon ions into the donor layer (2) in step c) it is preferable to deposit an oxide layer on the surface of the donor layer (2) in order to avoid sputtering of silicon at the surface.

After implantation of carbon ions in step c) the donor layer (2) which is bonded to the handle wafer (5) via bond interface (15) has the following structure (FIG. 7): The donor layer (2) comprises a layer (4) comprising implanted carbon and a superficial layer (21) comprising monocrystalline silicon. The lower boundary of the layer (4) comprising implanted carbon can be situated either within the donor layer (2) or within the handle wafer (5) or can coincide with the bond interface (15).

Next, heat-treating of the donor layer (2) comprising the layer (4) comprising implanted carbon is performed in step d). After heat-treatment the donor layer (2), being attached to the handle wafer (5), has the following structure (FIG. 7): A layer (40) comprising silicon carbide has been formed within the donor layer (2). The layer (40) comprising silicon carbide may be covered by a superficial layer (21) comprising monocrystalline silicon. The latter layer is situated at the surface of the donor layer (2). Depending on the original position and composition of the layer (4) comprising implanted carbon, the layer (40) comprising silicon carbide can be situated as a whole within the donor layer (2) or part of the layer (40) comprising silicon carbide can extend to the handle wafer (5). The part of the layer (40) comprising silicon carbide which is situated within the donor layer (2) is referred to as the silicon carbide donor layer (44) in this embodiment.

The superficial layer (21) comprising monocrystalline silicon and, preferably, a portion of the silicon carbide donor layer (44) is removed in step g). For example, if the silicon carbide donor layer (44) comprises an upper varying carbon concentration zone (41), it is preferable to remove at least a portion or all of this zone. This may be done in a way similar to step f) as described previously for the first preferred embodiment.

In a variation of this embodiment, a process step or sequence of process steps which completely or partially remove the superficial layer (21) and optionally a portion of the layer (4) comprising implanted carbon prior to implant annealing in step d) are also possible. The removal can be effected via polishing, chemical etching or thermal oxidation with subsequent oxide removal or a combination thereof. Removal of the superficial layer (21) and optionally of a portion of the layer (4) comprising implanted carbon has the advantage that the layer (4) comprising implanted carbon has a free surface which allows influencing the formation of the silicon carbide donor layer (44) via surface diffusion effects and choice of gas ambient and even active precursors. The exposed surface may be optionally smoothened with CMP.

The optional steps h) and i) may be performed as described for the first preferred embodiment.

This embodiment eliminates the thermal expansion coefficient mismatch problems associated with thick donor and handle wafers in embodiment 2 while keeping the advantage of combining the implant anneal and the bond anneal. The risk of contamination from the handle wafer during the anneal can be eliminated by using either very pure handle wafers or using suitable sealing layers. Assuming that thermal mismatch limits the annealing temperature in embodiment 2, then this embodiment 3 allows a higher anneal temperature as the thick donor wafer is thinned (step f) prior to annealing (step d). This embodiment also allows control of the position of the boundary between the lower varying carbon concentration zone (43) and relative to the bond interface (15). The position can be directly controlled during the implantation process without the need to selectively remove layers.

Preferred Embodiment 5

According to a fifth preferred embodiment of the invention, the donor layer (2) (comprising, as the case may be, monocrystalline silicon or a layer (4) comprising implanted carbon or a silicon carbide donor layer (44)) can also be transferred from the donor wafer (1) to the handle wafer (5) using the so-called "Smart-cut" process as described in U.S. Pat. No. 5,374,564. This preferred embodiment can be combined with any of the first to fourth preferred embodiments.

According to this embodiment, light ions like hydrogen or noble gas ions are implanted into the donor wafer (1) in order to define a separation layer between the donor layer (2) and the remainder (3) of the donor wafer. This implantation is performed prior to bonding the donor wafer (1) to the handle wafer (5) in step e) and preferably after the carbon ion implantation in step c) and implant anneal in step d). The remainder (3) of the donor wafer can then be removed in step f) by a heat-treatment known as "split anneal". This leads to a thermal cleaving at the pre-defined separation layer, leaving a cleaved surface portion. The "Smart-cut" process is described in detail in U.S. Pat. No. 5,374,564.

This preferred embodiment has the advantage that the remainder (3) of the donor wafer may be re-claimed (e.g. etched and polished) and further used. In the case of grinding, the remainder (3) of the donor wafer is destroyed. As silicon substrates are very low in cost, and grinding and etching are relatively low cost process steps, it may prove more advantageous to grind and etch the substrates, particularly for low cost smaller diameter silicon wafers.

EXAMPLE

Step a) A polycrystalline SiC handle wafer (5) is prepared by cutting a 100 mm wafer from an ingot consisting of hot-pressed sintered 3c polycrystalline SiC with low porosity ($\leq 4\%$) and high purity. After cutting, the wafer is mechanically ground and polished to achieve a surface roughness of <0.7 nm RMS (AFM, 10 µm×10 µm). This polycrystalline SiC material is matched to the thermal expansion coefficient of monocrystalline SiC. The thickness of the polycrystalline SiC wafer is 400 µm, with a warp value $\leq 10$ µm and a TTV value of <2 µm.

Step b) A polished monocrystalline silicon donor wafer (1) having a diameter of 100 mm, <111> orientation, TTV$\leq 2$ um, Warp$\leq 10$ um, n-type phosphorous doped, resistivity 10 $\Omega$cm, with an RMS roughness of <0.2 nm (AFM, 10 µm×10 µm) is thermally oxidized at 900° C. to form an oxide layer of 50 nm thickness. The oxide layer protects the wafers surface from potential contamination during implantation and prevents sputtering of the silicon donor wafer surface.

Step c) The oxidized donor wafer (1) is implanted with carbon ions at 7° tilt to an average peak depth of 470 nm. The implantation parameters are 6.75 Atoms/cm$^2$ dose at 180 keV acceleration energy, at a constant temperature of 550° C.

Step d) After implantation, the oxide is stripped from the surface of donor wafer (1). Then the donor wafer (1) is annealed to synthesize a buried layer (40) comprising silicon carbide of 3c crystal structure. Several donor wafers (1) are loaded into a horizontal furnace at 600° C., ramped at a rate of 10 K/min to a temperature of 1000° C. and then at a rate of 5° C./min to a temperature of 1200° C. The donor wafers (1) are then annealed in an argon ambient for ten hours at 1200° C., and subsequently ramped down at a rate of 5 K/min to 600° C., whereon they are then unloaded from the furnace. The layer (40) comprising silicon carbide which has been formed in the donor wafer (1) comprises three zones:

- an upper varying carbon concentration zone (41), containing silicon, SiC nano-particles, extended lattice defects and having an average thickness of 100 nm,
- a monocrystalline silicon carbide zone (42), with a layer thickness of approximately 140 nm which is situated at approximately 400 nm from the surface, and
- a lower varying carbon concentration zone (43), containing silicon, SiC, extended lattice defects, and EOR (end of range damage) implant damage and having an average thickness of 30 nm.

The whole layer (40) comprising silicon carbide is free from twins and does not contain any additional SiC polytypes besides the 3c polytype.

Step e) The donor wafer (1) comprising the buried layer (40) comprising silicon carbide is now cleaned by using RCA-type cleaning to remove particles and metallic or organic contaminations. The surface roughness of the silicon superficial layer (21) of the donor wafer is <0.2 nm RMS (AFM, 10 µm×10 µm), which is typical for polished silicon wafers. The donor wafer (1) is now bonded to the handle wafer (5) using a conventional bonding system (supplied by EVG) utilizing an in-situ hydrophilic surface treatment just before bonding. Bonding is performed at room temperature. To increase bonding strength, the bonded donor and handle wafers (1, 5) are annealed at 1000° C. for one hour in an argon ambient using a conventional horizontal furnace.

Step f) After bond anneal the remainder (3) of the donor wafer is removed by using the following steps:

- mechanical back-grinding of the silicon to a remaining silicon thickness of 10 µm,
- chemical etching of the remaining silicon using a mixture of HF/HNO$_3$, which stops in the lower varying carbon concentration zone (43), and
- thermal oxidation of the remaining portion of the lower varying carbon concentration zone (43) and subsequent oxide stripping with a buffer HF solution.

Step h) The surface of the exposed monocrystalline silicon carbide zone (42) is subjected to chemical-mechanical polishing using a commercial polishing system (2 pounds/square inch, 5 minutes, with a silica colloidal slurry at room temperature), and subsequently cleaned. The resulting surface is scratch-free and has a surface roughness of <0.5 nm RMS (AFM, 10 μm×10 μm). The remaining monocrystalline silicon carbide zone (42) of 3c crystal structure has now an average thickness of 70 nm Step i) An epitaxial layer (6) of nitride containing III/V compounds is grown on the exposed monocrystalline silicon carbide zone (42). First an AlN layer with a thickness of 150 nm is grown at 1100° C., followed by a deposition of an GaN layer (4 μm thickness, 1100° C., trimethylgallium and ammonia precursors, MOCVD, tool from Aixtron). After cooling down from the epitaxial process, no cracks can be detected in the monocrystalline GaN epitaxial layer (6). The defect densities are relatively low, typically below 5E9 dislocations/cm$^2$ as measured by TEM. The epitaxial layer (6) contains no twins.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A multilayered semiconductor wafer comprising a handle wafer and a silicon carbide donor layer which is bonded to the handle wafer at an interface, wherein the silicon carbide donor layer comprises at least one varying carbon concentration zone in which the concentration of carbon atoms varies in a direction normal to the interface of the layer.

2. A multilayered semiconductor wafer of claim 1, wherein the silicon carbide donor layer is free of twins and free of additional silicon carbide polytypes, as determined by X-ray diffraction.

3. A multilayered semiconductor wafer of claim 1, having a diameter of more than 100 mm.

4. A multilayered semiconductor wafer of claim 1, wherein the silicon carbide donor layer has an interface that is not bonded to the handle wafer which consists of at least 90% crystalline silicon carbide.

5. A multilayered semiconductor wafer of claim 1, wherein the silicon carbide donor layer comprises a monocrystalline silicon carbide zone.

6. A multilayered semiconductor wafer of claim 1, wherein the silicon carbide donor layer is free of micropipes as determined by scanning electron microscopy.

7. A multilayered semiconductor wafer of claim 1, wherein the silicon carbide donor layer is an ion-beam synthesized silicon carbide layer.

8. A multilayered semiconductor wafer of claim 1, wherein the silicon carbide of the silicon carbide donor layer has a 3c structure.

9. A multilayered semiconductor wafer of claim 1, wherein the silicon carbide donor layer has a thickness of 15 nm to 300 nm.

10. A multilayered semiconductor wafer of claim 1, wherein the handle wafer consists of polycrystalline silicon carbide.

11. A multilayered semiconductor wafer of claim 1, further comprising at least one interposed layer between the handle wafer and the silicon carbide donor layer, the interposed layer being selected from the group of insulating, reflecting and sealing layers.

12. A multilayered semiconductor wafer of claim 1, further comprising an additional layer consisting of monocrystalline silicon which is interposed between the handle wafer and the silicon carbide donor layer.

13. A multilayered semiconductor wafer of claim 1, further comprising at least one epitaxial layer which is deposited on the silicon carbide donor layer, the epitaxial layer comprising a material selected from the group consisting of aluminum nitride, gallium nitride, indium nitride, gallium aluminum nitride, gallium indium nitride, silicon carbide, zinc oxide, cadmium oxide and magnesium oxide.

14. A device produced on a substrate of claim 13, wherein the device is a LED, a high electron mobility transistor, a microwave device, a high frequency device or a power device.

* * * * *